United States Patent [19]

Linnon

[11] 4,054,478

[45] Oct. 18, 1977

[54] METHOD OF MANUFACTURING A THERMOELECTRIC DEVICE

[75] Inventor: Robert C. Linnon, Livingston, N.J.

[73] Assignee: Nu-Pak Corporation, Denville, N.J.

[21] Appl. No.: 689,730

[22] Filed: May 25, 1976

[51] Int. Cl.² .................. B01J 3/00; H01L 35/34; B29G 1/00

[52] U.S. Cl. .................... 156/242; 29/573; 29/576 J; 29/581; 29/582; 156/285

[58] Field of Search ............ 156/228, 242, 276, 246, 156/285; 29/576, 581, 582, 573, 599, 620, 624, 625, 627, 631, 626; 136/200, 201, 225, 227, 228, 236–241; 427/82, 86, 87

[56] References Cited

U.S. PATENT DOCUMENTS

| | | | |
|---|---|---|---|
| 3,342,655 | 9/1967 | Crownover | 150/242 |
| 3,378,704 | 4/1968 | Miller et al. | 29/573 |
| 3,616,003 | 10/1971 | Kohashi et al. | 156/242 |

Primary Examiner—Caleb Weston
Attorney, Agent, or Firm—Martin G. Raskin

[57] ABSTRACT

A method of manufacturing a thermoelectric device comprising initially preparing thin coherent films of P and N type thermoelectric materials by evaporating the solvent from a suspension previously drawn over a surface, the suspension comprising the solvent, a binder and the thermoelectric material in powdered form. A coherent film of insulative material is similarly prepared. The coherent films are stacked in a hot press die with alternate P and N type thermoelectric films separated by the insulative film and subjected to heating and pressure during which the binders are volatilized so that the thermoelectric films are converted to solid, high density layers and the insulative films each become a cohesive layer which binds to the adjacent thermoelectric layers to form a monolithic laminate. Contacts electrically connecting the P and N type thermoelectric layers may be provided prior or subsequent to the pressing step. On removal from the die the assembly may be a completed device or may be further machined into slices which are subsequently reassembled into multicouple thermopiles.

10 Claims, 3 Drawing Figures

METHOD OF MANUFACTURING A THERMOELECTRIC DEVICE

BACKGROUND OF THE INVENTION

This invention relates generally to thermoelectric devices and, more particularly, to methods for manufacturing thin film thermoelectric devices having high voltage densities at any temperature range of operation.

Over the past few years there has been substantial activity in the field of thin film thermoelectric devices, especially for use in electrical generator applications. Attempts to construct such generators using metallic thermocouples have not proven successful, however, due to the very low power of even the more favorable couples, e.g., bismuth and antimony, which generate not more than 0.1 mV per degree Centigrade. Therefore, semiconductor materials which possess high thermoelectric power, high electrical conductivity, but low thermal conductivity have been extensively used.

In the past, thin film thermocouples, i.e., thermocouples formed of layers of thermoelements ranging in thickness from 50 mils to fractions of a mil, have been manufactured by various techniques, such as machining from bulk materials by slicing and grinding, etching, sputtering and vapor deposition. In general, the thermoelectric elements are deposited directly on the insulating materials and the electrical contacts provided to form the couples. Compacting and sintering powdered thermoelectric elements has been suggested but this method cannot be applied to the formation of thin film thermocouples. See U.S. Pat. No. 3,086,068 granted to Charland et al. on Apr. 16, 1963. However, these techniques have proven to be somewhat less than satisfactory. Machined thermoelements cannot be produced in quantity in very small dimensions because the thermoelectric elements are inherently structurally weak. Vapor deposition and related techniques are difficult to control and quantity production of devices using this method has not been successful. Thin film thermoelectric devices produced using these techniques often require additional support in order to retain their structural integrity since the thin films themselves are not self-supporting. Thus, a problem exists in the production of thermoelectric devices of uniform dimensions in production quantities.

An equally imposing obstacle exists to the manufacture of thin film thermocouples for use as electrical generators. As mentioned above, the thermoelectric power of metallic thermoelements is too low to permit their use in such application. The efficiency of a metallic thermocouple is no more than 1 percent. Thus, widespread attention has been focused on thermoelectric generators employing semiconductors as the thermoelements. However, even using those semiconductors which appear most promising, such as bismuth telluride ($Bi_2Te_3$), thermoelectric power ratings of only about 0.25 mV per degree Centigrade and an efficiency of no more than about 7 percent have been achieved.

SUMMARY OF THE INVENTION

Accordingly it is an object of this invention to provide a new and improved method for manufacturing thin film thermoelectric devices.

It is another object to provide a new and improved method for manufacturing a thin film thermoelectric device having high efficiency.

It is still another object of the present invention to provide a new and improved method for manufacturing a thermoelectric device which has a high voltage density in any desired temperature range of operation.

It is a further object of the present invention to provide a new and improved method for manufacturing thermoelectric devices in production quantities.

It is a still further object of the present invention to provide a new and improved method for manufacturing thermoelectric devices having uniformly precise dimensions in production quantities.

It is a yet still further object to provide a new and improved thermoelectric device.

Briefly, in accordance with the present invention, these and other objects are attained by providing a method wherein coherent films of thermoelectric materials are prepared by forming two supsensions of powdered "P" and "N" type thermoelectric materials by mixing them with a binder and a liquid carrier. Coherent films of the "P" and "N" type materials are formed by drawing the suspension over a surface and allowing the liquid carrier to evaporate. A coherent film of an insulative material is similarly prepared. Thin films are stacked in a hot press die with alternate "P" and "N" type thermoelectric films being separated by insulative films. The stacked films are subjected to heat and pressure during which the binders are volatized converting the thermoelectric films to solid, high density layers and the insulative film becoming a cohesive layer which bonds to the adjacent thermoelectric layers to form a monolithic laminate. Contacts electrically connecting the "P" "N" type thermoelectric layers may be provided prior or subsequent to the pressing step.

By forming the individual thin coherent films of thermoelectric material as described, precise control may be maintained over their dimensions. Further, these thin films are entirely self-supporting thereby eliminating the need for support packaging. However, more importantly, by a mechanism which is not entirely understood, the surprising discovery has been made that by manufacturing the thermoelectric device according to the above-described method, the Seeback coefficient of the thermoelectric material is increased dramatically. By increasing the Seeback coefficient, the so-called "figure of merit" Z, defined as the ratio of the Seeback coefficient, S squared to the product of electrical resistivity P, and the thermal conductivity, K, (i.e. $Z = S^2/PK$) is correspondingly increased. The figure of merit Z is an important factor in thermoelectric devices used for power generation since the theoretical maximum efficiency, $\eta$, obtainable is related to Z in the following way:

$$\eta = \frac{Ti - To}{Ti} \times \frac{\sqrt{\left(\frac{Ti + To}{2}\right)Z + 1} - 1}{\sqrt{\left(\frac{Ti + To}{2}\right)Z + 1} + \frac{To}{Ti}}$$

where $Ti$ = temp. at the hot junction and $To$ = temp. at the cold junction. The above described method of manufacture results in a surprising increase in the Seeback Coefficient, resulting in corresponding increases in the "figure of merit" Z, and the theoretical maximum efficiency obtainable $\eta$.

DESCRIPTION OF THE DRAWINGS

A better appreciation of the invention will be obtained when considered in view of the following detailed description and drawings in which.

DESCRIPTION OF THE PREFERRED EMBODIMENT

Figure 1:
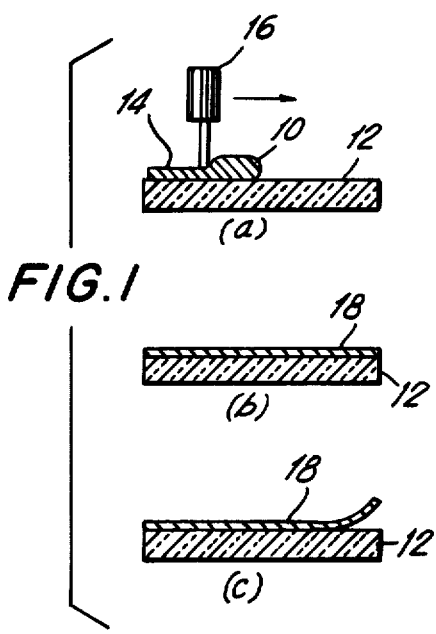
FIG. 1 are elevational views showing the steps of forming the coherent film according to the referred embodiment of the invention.

Referring to the drawings wherein like reference characters designate identical or corresponding parts throughout the several views and, more particularly, to FIG. 1, a suspension 10 of a "P" type thermoelectric material is prepared by grinding the material in, for example, a ball mill until a desired particle size is achieved. The ground material is then added to and mixed with a liquid carrier, preferably an organic solvent and a binder soluble in the solvent. The suspension is poured over a support having a clean, smooth, impervious surface 12 formed of a material which will not chemically interact with the solvent, and drawn into a film 14 by any conventional method, such for example, as by doctor blading. In this method, a doctor blade 16, usually formed of steel, is passed across the surface 12 of the support. The distance between the end of the doctor blade 16 and surface 12 which defines the thickness of the film produced may be precisely controlled and may vary from fractions of a mil to 25 mils. Such a technique for the formation of films in general is conventional. See, for example, H. A. Gardner, Physical and Chemical Examination of Paints, Varnishes, Lacquers and Colors, Institute of Paint and Varnish Research (1935). The solvent is then allowed to evaporate leaving a thin coherent film 18 on surface 12 which is self-supporting and which can be peeled from surface 12 as shown in FIG. 1(c).

A preferred embodiment for preparing the coherent "P" type thermoelectric film will now be described. A quantity of doped "P" type bismuth telluride ($Bi_2Te_3$) is ground in a ball mill until a powder is obtained having a particle size of about −80 mesh (U.S. Standard Sieve). About 50 grams of the powdered $Bi_2Te_3$ is added to about a 100 milliliters of acetone solution. Approximately 8 grams of the binder material, which in the preferred embodiment constitutes methyl methacrylate, is added, to form suspension 10. The suspension is then poured over surface 12 which peferably is formed of glass, and doctor bladed to a thickness of 1 mil. The solvent may then be evaporated by allowing the film to dry in air, which may be facilitated by the circulation of air over the film 14. It has been found convenient to accelerate the solvent evaporation by drying the film in an oven at an elevated temperature for a short time.

After the solvent has evaporated, the film containing the particulate thermoelectric material is coherent or self-supporting and can be removed from the surface as shown in FIG. 1(c) and dimensioned such as by stamping into a size convenient for the pressing operation, described hereinbelow, whereby the thermoelectric device is constructed. In this manner a plurality of "P type thermoelectric films may be fabricated.

A process which is substantially identical to the one described above with regard to the "P" type thermoelectric material film is followed to construct one or more coherent films of "N" type thermoelectric material. More particularly, a quantity of doped "N" type bismuth telluride ($Bi_2Te_3$) is ground in a ball mill to a particulate of about −80 mesh. About 50 grams of the powdered thermoelectric material is added to about a 100 milliliters of acetone solution. About 8 grams of methyl methacrylate is introduced to form a suspension which is drawn into a film, the solvent then being evaporated to leave a coherent or self-supporting film, which may then be peeled from the supporting surface and dimensioned for subsequent assembly into the thermoelectric device.

In the fabrication of thermoelectric devices it is necessary to isolate the positive and negative branches of the thermocouples (the "P" and "N" type thermoelectric elements herein) from each other and adjacent thermocouples in all areas other than the electric contacts. In the past, the usual practice has been to employ fibrous refractor insulating material in conjuncton with refractor metal foils to provide low thermal conductivity electrical isolation. In the present invention, an insulating material is provided in a form which provides electrical isolation for the branches of the thermocouple, low thermal conductivity and which also has the unique capability of forming a chemical bond with the adjacent thermoelements to produce a structurally rigid thermocouple or thermopile.

A powdered refractory material such as, but not limited to, a metal oxide such as silicon dioxide ($SiO_2$) is placed in suspension with a solvent and binder. The insulating material may be ground to the same size as the thermoelectric materials described hereinabove, with the solvent and binder comprising the same solutions as described above, the same proportions of materials also being utilized. The suspension is drawn such as by a doctor blade over a flat surface as before to the desired thickness. The solvent is allowed to evaporate rendering the film self-supporting and the coherent film removed from the surface and formed into a size convenient for the fabrication of the thermoelectric device as described below.

It is to be understood that the solvent employed as a carrier for the suspensions given as an example above are merely typical of the type which may be employed in the practice of the present invention. Others which may be used include methyl ethyl ketone, toluene, and alcohol. Drying rates, viscosity, desired film thickness, compatability in solution, amount of binder, amount of residue after evaporation, drying surface and other similar factors determine which solvent should be used for a particular application. Any binder which is soluble in the particular solvent chosen may be employed, such as acetates, nitrocellulose, or any of the thermoplastic synthetic organic film-forming materials such as polyvinyl chloride polymers, polester polymers and cellulose acetate butyrate polymers. The relative proportion of the constituents of the slurry may also be varied from the example set forth abovve depending upon the time available for manufacture, etc.

It should also be understood that the films may be formed using any of the well known thermoelectric materials besides bismuth telluride having the desired electrical and thermal properties. Such materials include Sb₂Te₃, Bi₂Se₃, ZnSb, etc. Also, as mentioned above, any of the refractory materials, and particularly, metallic oxides may be used for the insulating material.

Figure 3:
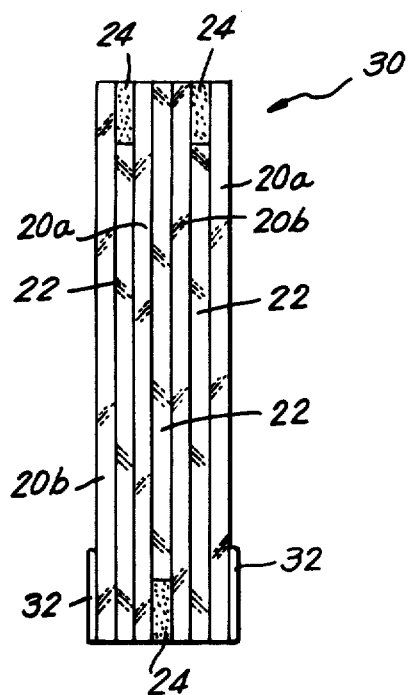
FIG. 3 is an enlarged side elevation view of a thermoelectric device manufactured according to the method of the present invention.
Figure 2:
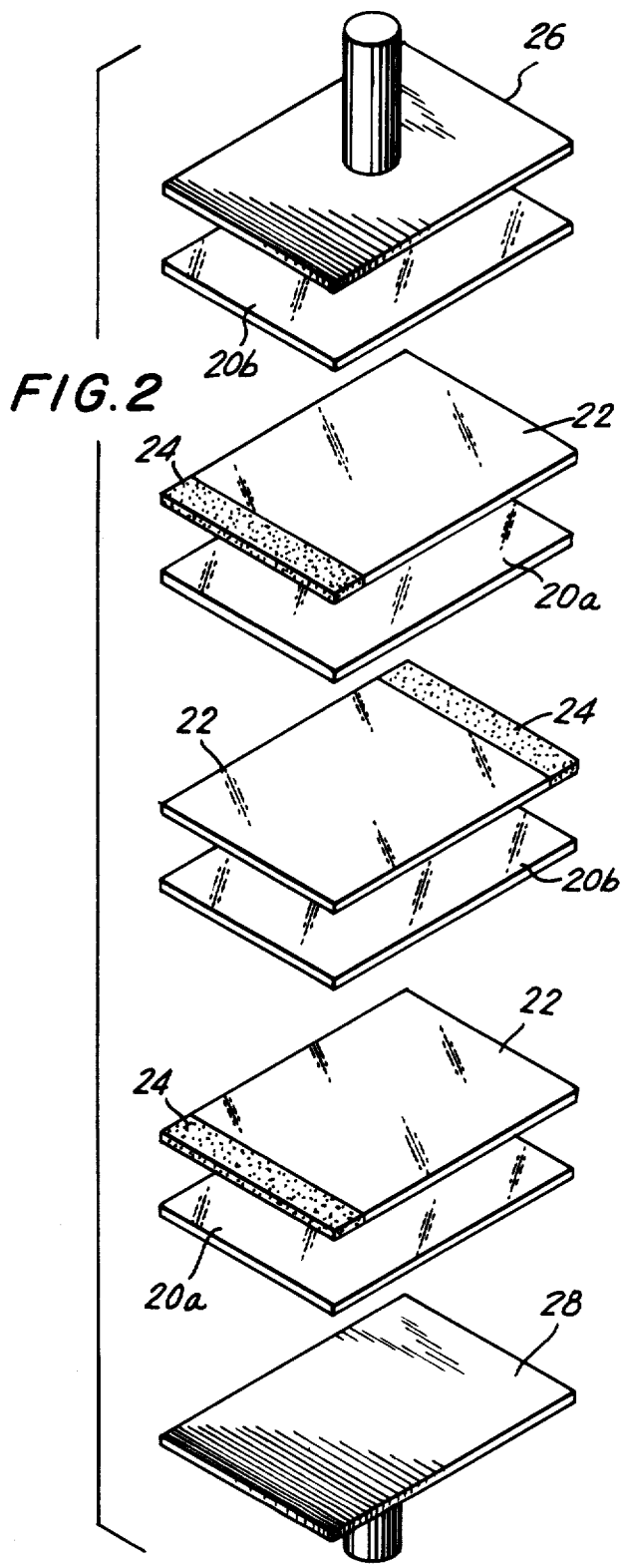
FIG. 2 is a diagrammatic, exploded perspective view of the compression and heating step of the stacked films.

After their formation, the coherent films of thermoelectric and insulating materials may be stored for future use in the construction of the thermoelectric device or may be immediately utilized. The following describes the manufacture of a thermopile including two thermocouples but it is understood that this invention comprises the manufacture of a single thermocouple in addition to thermopiles including many, such for example, as eighty such thermocouples. Referring to FIG. 2, "P" type thermoelectric coherent films 20a, "N" type thermoelectric coherent films 20b and insulating films 22 are alternatively stacked upon one another (with the insulating films 22 being interposed between adjacent pairs of "P" and "N" type thermoelectric films 20a, 20. Metallic contacts 24, formed of a conductive material such as gold, may be metallurgically bonded in a conventional manner to the opposite ends of alternate insulatng films 22 prior to stacking which electrically couple the respective ends of the "P" and "N" type thermoelectric films with which they are contiguous. Of course, any material which provides a low electrical resistance path and which is compatible with the thermoelectric material may be used. The stacked assembly is then placed between the platens 26, 28 of a conventional hot press die (not shown). Graphite spacers (not shown) may be used to support the materials in the die during the subsequent hot pressing operation to obviate the tendency of the films to stick to the hot platens. The platens 26, 28 now press the stacked assembly together. In the typical example, the press exerts a pressure of about 6 to 12 KPSI at a temperature between 350° to 400° C for a period of 2 to 5 minutes. This operation is carried out in an inert atmosphere, such as a vacuum. At the conclusion of this cycle, the system is permitted to cool down and the stacked assembly is removed from the vacuum hot press die. During the pressing step, the films in the stack are bonded toether by the action of the heat and pressure to form a monolithic laminate 30 (FIG. 3).

During the hot pressing step, the binder in the films are volatized and the thermoelectric materials contained in the films are converted for the powder to its original, solid, high temperature condition with its thermal and electrical properties restored. The insulatng material separating the thermoelecrric material becomes a cohesive mass which does not distort under compression and which bonds to the adjacent thermoelements forming a solid structure.

On removal from the die, the assembly may be used as a completed device or may be further machined into slices which are subsequently reassembled into a thermoelectric device containing up to thousands of thermocouples with exceptional thermoelectric characteristics. Referring to FIG. 3, the resulting thermoelectric device 30 is shown. External contacts 32 are metallurgically bonded to the edges of the thermoelectric elements 20b, 20a, at what will be the cold end during the use of the device.

The temperatures and pressures used for bonding will vary according to the binders used and according to the number and thicknesses of films to be bonded. The range within which the temperature will normally be is about 150° to 600° C, the pressures ranging from about 2 to 16 KPSI and the time being in the range of 0.5 minutes to 1 hour.

The thermoelectric devices which result from the practice of the present invention have the high voltage characteristics necessary for such applications as the electric generator for nuclear powered implantable pacemakers. Such a device has been made using the particular typical example of constituents described above. The coherent films are cut into sections approximately 0.75 inches wide and 0.58 inches high, the silicon dioxide layers being about 0.050 inches shorter to accommodate the metallic contacts 24. The thickness of the bismuth telluride layers is about 3 mils and thickness of the silicon dioxide layer is about 2 mils. It has been found that the electrical resistance to room temperature of such a device is between 600 and 800 milliohms per couple. At a hot junction temperature of 100° C and a cold junction temperature of 35° C, the device has voltage characteristics of approximately 22 millivolts per couple. For application as an electrical generator for a pacemaker, approximately 30 couples in a single assembly are prepared, the assembly machined into sections about 10 mils thick and reassembled into a device containing 330 thermocouples. Undr the apropriate thermal gradient, this unit will provide sufficient voltage and power to operate conventional pacemaker electronics. Further, the thermoelectric devices produced from this method are capable of operating both at high temperatures (900° - 1100° C) and low temperatures (up to 150° C).

Thus, it can be seen that the thermoelectric devices produced by the method of the present invention have a relatively high efficiency and voltage density and are operable under both high and low temperature ranges. The particular method has been found to be quite amenable to manufacture in production quantities, while still maintaining precise dimensional control over the elements.

Of course, numerous variations and modifications are possible in light of the above teachings. Accordingly, this invention is not to be limited to the typical examples set forth above but may be otherwise practiced within the scope of the claims.

I claim:

1. The method of manufacturing a thermoelectric device which includes a plurality of thin thermoelectric layers and insulative layers comprising the steps of:
    forming a first suspension comprising a powdered P-type thermoelectric material, a binder and a liquid carrier;
    drawing the first suspension over a surface and allowing the liquid carrier to evaporate to form a first coherent film;
    forming a second suspension comprising a powdered N-type thermoelectric material, a binder and a liquid carrier;
    drawing the second suspension over a surface and allowing the liquid carrier to evaporate to form a second coherent film;
    forming a third suspension comprising an insulative material, a binder and a liquid carrier;
    drawing the third suspension over a surface and alowing the liquid carrier to evaporate to form a third coherent film;
    stacking said first, second and third coherent films with said third coherent film interposed between and electrically insulating said first and second coherent films;
    compressing and heating said stack of films in a inert atmosphere to volatize said binders converting said coherent films to first and second solid thermoelectric layers and a third solid insulative layer and to bond the third insulative layer to the adjacent thermoelectric layers to form a laminate.

2. The method of claim 1 wherein said inert atmosphere comprises a vacuum.

3. The method of claim 1 wherein said heating and compressing step comprises heating and compressing said stack of films at a temperature in the range of about 150° to about 600° C at a pressure in the range of 2 to 16 KPSI for a period of between 0.5 minutes to 1 hour.

4. The method of claim 1 wherein said heating and comprssing step comprises heating and compressing said stack of films at a temperature in the range of about 350° C to about 400° C at a pressure in the range of about 6 to about 12 KPSI for a period of between 2 to 5 minutes.

5. The method of claim 1 wherein said thermoelectric material comprises bismuth telluride.

6. The method of claim 1 wherein said step of forming said first and second suspensions comprises the steps of mixing the binder, liquid carrier and powdered thermoelectric material according to the ratio of about 100 milliliters of liquid carrier, about 4 to 12 grams of binder and about 25 to 75 grams of powdered thermoelectric material.

7. The method of claim 1 wherein said powdered thermoelectric material comprises particles of thermoelectric material having a size in the range of $-40$ to $-200$ mesh.

8. The method of claim 1 comprising the further step of interposing metallic contact elements at one end of the stack of films prior to heating and compressing said stack, said contact elements electrically connecting the ends of the first and second coherent films.

9. The method of claim 8 wherein said metallic material comprises gold.

10. The method of claim 1 further including the step of machining the laminate subsequent to its formation into a plurality of slices and then assembling said slices into a thermoelectric device.

* * * * *